United States Patent
Sakamoto et al.

(10) Patent No.: US 11,903,126 B2
(45) Date of Patent: Feb. 13, 2024

(54) LAMINATE, ELECTRONIC COMPONENT, AND LAMINATE PRODUCTION METHOD

(71) Applicant: Murata Manufacturing Co., Ltd., Kyoto (JP)

(72) Inventors: Sadaaki Sakamoto, Kyoto (JP); Yutaka Senshu, Kyoto (JP); Yasutaka Sugimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 385 days.

(21) Appl. No.: 17/345,141

(22) Filed: Jun. 11, 2021

(65) Prior Publication Data

US 2021/0307162 A1 Sep. 30, 2021

Related U.S. Application Data

(63) Continuation of application No. PCT/JP2019/049015, filed on Dec. 13, 2019.

(30) Foreign Application Priority Data

Dec. 20, 2018 (JP) ................................ 2018-238709

(51) Int. Cl.
H05K 1/02 (2006.01)
H05K 1/03 (2006.01)
(Continued)

(52) U.S. Cl.
CPC ........... *H05K 1/0306* (2013.01); *B32B 3/266* (2013.01); *B32B 17/06* (2013.01); *B32B 37/06* (2013.01);
(Continued)

(58) Field of Classification Search
CPC .......... H05K 1/02; H05K 1/03; H05K 1/0306; H05K 1/162; H05K 3/0023; H05K 3/266;
(Continued)

(56) References Cited

U.S. PATENT DOCUMENTS

| | | | | |
|---|---|---|---|---|
| 4,672,152 A | * | 6/1987 | Shinohara | ........... C03C 10/0027 257/E23.173 |
| 10,046,542 B2 | * | 8/2018 | Adib | ..................... C03C 23/006 |

(Continued)

FOREIGN PATENT DOCUMENTS

| | | |
|---|---|---|
| JP | H10-167810 A | 6/1998 |
| JP | 2002-047058 A | 2/2002 |

(Continued)

OTHER PUBLICATIONS

International Search Report for PCT/JP2019/049015 dated Mar. 3, 2020.
Written Opinion for PCT/JP2019/049015 dated Mar. 3, 2020.

*Primary Examiner* — Xiaoliang Chen
(74) *Attorney, Agent, or Firm* — Pearne & Gordon LLP

(57) ABSTRACT

The laminate of the present disclosure includes multiple glass ceramic layers each containing quartz and a glass that contains $SiO_2$, $B_2O_3$, $Al_2O_3$, and $M_2O$, where M is an alkali metal. The B concentration of a surface layer portion of the laminate is lower than the B concentration of an inner layer portion of the laminate.

15 Claims, 1 Drawing Sheet

(51) Int. Cl.
  *B32B 17/06* (2006.01)
  *B32B 37/18* (2006.01)
  *C03C 10/00* (2006.01)
  *H01L 23/15* (2006.01)
  *B32B 3/26* (2006.01)
  *B32B 37/06* (2006.01)

(52) U.S. Cl.
  CPC .......... B32B 37/18 (2013.01); C03C 10/0018 (2013.01); C03C 10/0054 (2013.01); *B32B 2255/205* (2013.01); *B32B 2307/202* (2013.01); *B32B 2307/206* (2013.01); *B32B 2310/049* (2013.01); *B32B 2311/08* (2013.01); *B32B 2311/12* (2013.01); *B32B 2315/02* (2013.01); *B32B 2315/08* (2013.01); *B32B 2457/04* (2013.01); *C03C 2204/00* (2013.01)

(58) Field of Classification Search
  CPC ...... H05K 3/4629; B32B 17/06; B32B 37/18; B32B 2255/205; C03C 10/00; C03C 10/0009; C03C 10/0018; C03C 10/0027; C03C 10/0054; H01L 21/486; H01L 23/15; H01L 23/5383; H01L 23/49827
  USPC ......... 362/782, 792, 811; 174/258; 428/210, 428/427, 428, 432, 901; 430/270.1, 313, 430/314, 315, 323
  See application file for complete search history.

(56) References Cited

U.S. PATENT DOCUMENTS

| | | | |
|---|---|---|---|
| 2003/0118842 A1* | 6/2003 | Moriya | H01L 23/15 428/428 |
| 2007/0128450 A1* | 6/2007 | Mori | H05K 1/0306 428/432 |
| 2009/0004438 A1 | 1/2009 | Urakawa | |
| 2009/0122506 A1* | 5/2009 | Sugimoto | B32B 18/00 361/811 |
| 2011/0195360 A1* | 8/2011 | Flemming | G03F 7/0043 430/323 |
| 2011/0217657 A1* | 9/2011 | Flemming | H01L 21/486 29/874 |
| 2013/0069182 A1* | 3/2013 | Ohsawa | H10N 50/10 257/E21.665 |
| 2018/0044244 A1 | 2/2018 | Sugimoto et al. | |
| 2018/0319129 A1 | 11/2018 | Sakamoto et al. | |

FOREIGN PATENT DOCUMENTS

| | | |
|---|---|---|
| JP | 2002-187768 A | 7/2002 |
| WO | 2008/126486 A1 | 10/2008 |
| WO | 2016/185921 A1 | 11/2016 |
| WO | 2017/122381 A1 | 7/2017 |

* cited by examiner

Distance from surface of laminate/ μm

LAMINATE, ELECTRONIC COMPONENT, AND LAMINATE PRODUCTION METHOD

CROSS REFERENCE TO RELATED APPLICATION

This is a continuation of International Application No. PCT/JP2019/049015 filed on Dec. 13, 2019 which claims priority from Japanese Patent Application No. 2018-238709 filed on Dec. 20, 2018. The contents of these applications are incorporated herein by reference in their entireties.

BACKGROUND OF THE DISCLOSURE

Field of the Disclosure

The present disclosure relates to laminates, electronic components, and methods for producing the laminates.

Description of the Related Art

Use of a laminate including multiple glass ceramic layers as an electronic component is known.

Patent Literature 1 discloses a dielectric material that has a low relative permittivity and a low dielectric loss, that is fireable at a temperature of 1000° C. or lower, and that is usable as a radio high frequency circuit component. The dielectric material contains 50 to 90% borosilicate glass that contains, in percent mass and in oxide equivalent, 70 to 85% $SiO_2$, 10 to 25% $B_2O_3$, 0.5 to 5% $K_2O$, and 0.01 to 1% $Al_2O_3$ and 10 to 50% $SiO_2$ fillers that are one or more kinds of fillers selected from α-quartz, α-cristobalite, and β-tridymite.

Patent Literature 2 discloses a laminate having high strength and low permittivity. The laminate includes a multilayer structure including a surface layer portion and an inner layer portion, wherein the surface layer portion and the inner layer portion each contain glass and quartz, the glass contained in each of the surface layer portion and the inner layer portion contains $SiO_2$, $B_2O_3$, and $M_2O$, where M is an alkali metal, and the quartz content of the surface layer portion is lower than the quartz content of the inner layer portion.

Patent Literature 1: JP 2002-187768 A
Patent Literature 2: WO 2017/122381

BRIEF SUMMARY OF THE DISCLOSURE

When the dielectric material disclosed in Patent Literature 1 is used, it is possible to lower the permittivity of the insulating portion of the electronic component. Unfortunately, this material has a composition containing a large amount of $SiO_2$ filler and therefore causes a low mechanical strength when used for a laminate.

Using the laminate disclosed in Patent Literature 2, it is possible to improve the mechanical strength as a result of controlling the coefficient of thermal expansion in the surface layer portion to be lower than the coefficient of thermal expansion in the inner layer portion. Unfortunately, in the case of achieving this lower coefficient of thermal expansion in the surface layer portion by replacing quartz by glass or amorphous $SiO_2$, the Q value becomes low.

The present disclosure is made to solve the above issues and aims to provide a laminate that can be used as an electronic component having a low permittivity, high mechanical strength, high Q value, and high reliability. The present disclosure also aims to provide a method for producing a laminate having these features.

The laminate of the present disclosure includes multiple glass ceramic layers each containing quartz and a glass that contains $SiO_2$, $B_2O_3$, $Al_2O_3$, and $M_2O$, where M is an alkali metal, a B concentration of a surface layer portion of the laminate being lower than a B concentration of an inner layer portion of the laminate.

An electronic component of the present disclosure includes a multilayer ceramic substrate including the laminate of the present disclosure and a chip component mounted on the multilayer ceramic substrate.

The method for producing a laminate of the present disclosure includes stacking multiple glass ceramic green sheets each containing quartz and a glass that contains $SiO_2$, $B_2O_3$, $Al_2O_3$, and $M_2O$, where M is an alkali metal, to provide a multilayer green sheet; and firing the multilayer green sheet to provide a glass ceramic layer, wherein the firing is performed in an environment containing steam.

The present disclosure can provide a laminate that can be used as an electronic component having a low permittivity, high mechanical strength, high Q value, and high reliability. The present disclosure can also provide a method for producing a laminate having the above features.

DETAILED DESCRIPTION OF THE DISCLOSURE

The laminate, electronic component, and laminate production method of the present disclosure are described hereinbelow. However, the present disclosure is not limited to the following structures and may be suitably modified without departing from the gist of the present disclosure. Combinations of two or more preferred structures of the present disclosure described in the following are also within the scope of the present disclosure.

Figure 1:
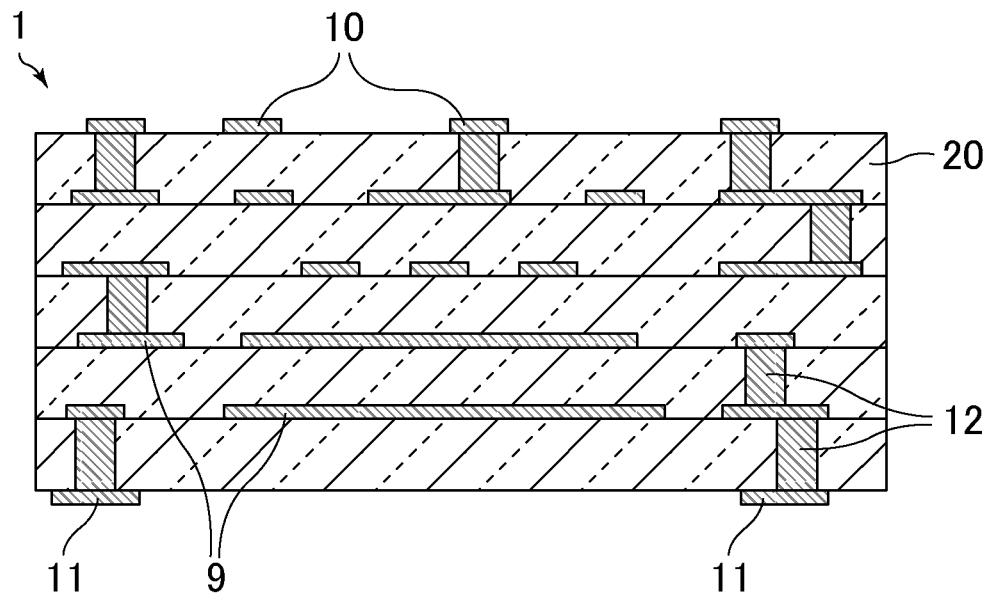
FIG. 1 is a schematic cross-sectional view of an example of a laminate.

First, the laminate of the present disclosure is described. FIG. 1 is a schematic cross-sectional view of an example of the laminate. A laminate 1 is a laminate including multiple glass ceramic layers 20 stacked. The laminate 1 includes an internal electrode. The internal electrode includes conductive films 9, 10, and 11 and via hole conductors 12. Conductive lines are used to constitute passive elements, such as capacitors or inductors, or to serve as connection lines to provide electrical connection between the elements. The internal electrode is preferably formed from a material containing Ag or Cu. An internal electrode formed from Ag or Cu is preferred because it is fireable at the sintering temperature of glass ceramic.

The conductive films 9 are provided inside the laminate 1. The conductive films 10 and 11 are provided respectively on a first main surface and a second main surface of the laminate 1. Each via hole conductor 12 is provided such that it is electrically connected to any of the conductive films 9, 10, and 11 and it penetrates any of the glass ceramic layers 20 in the thickness direction.

The first main surface of the laminate 1 may be provided with a chip component (not illustrated) in the state of being electrically connected with the conductive film 10. The conductive film 11 on the second main surface of the laminate 1 is used as an electrical connector during mounting the chip-mounted laminate on a motherboard that is not illustrated.

Each glass ceramic layer in the laminate of the present disclosure contains quartz and a glass that contains $SiO_2$, $B_2O_3$, $Al_2O_3$, and $M_2O$, where M is an alkali metal.

The glass preferably has a $SiO_2$ content of 72% by weight or more and 88% by weight or less.

The glass preferably has an $Al_2O_3$ content of 0.1% by weight or more and 2% by weight or less.

$M_2O$ may be of any type that is an alkali metal oxide, and is preferably any of $Li_2O$, $K_2O$, and $Na_2O$, more preferably $K_2O$. $M_2O$ may include one alkali metal oxide or may include two or more alkali metal oxides. The glass preferably has a $M_2O$ content of 1% by weight or more and 3% by weight or less. In the case of using two or more alkali metal oxides as $M_2O$, the sum of the amounts thereof is defined as the $M_2O$ content.

The whole laminate preferably has a $B_2O_3$ content of 10% by weight or more and 26% by weight or less.

The glass contained in each glass ceramic layer may further contain an alkaline earth metal oxide such as CaO. The glass may further contain other impurities. The amount of impurities, when contained, is preferably less than 5% by weight.

Each glass ceramic layer contains quartz in addition to the glass. Quartz is added as a filler. In addition to quartz, any of $Al_2O_3$ filler and $ZrO_2$ filler may be added as a filler. The filler as used herein means an inorganic additive not included in the glass. Each glass ceramic layer preferably has a filler content of 25% by weight or more and 39% by weight or less.

When a glass having a high $SiO_2$ proportion in each glass ceramic layer is used together with quartz, it is possible to provide the laminate with a low permittivity. The relative permittivity may be reduced to 4.5 or lower, for example. This is because both $SiO_2$ and quartz are materials having a relative permittivity of 4.5 or lower.

In the laminate of the present disclosure, the B concentration (boron concentration) of the surface layer portion of the laminate is lower than the B concentration of the inner layer portion of the laminate. The B concentration of the laminate can be determined by obtaining the B concentration distribution relative to the distance from a surface of the laminate by means of the secondary ion mass spectrometry (SIMS).

Figure 2:
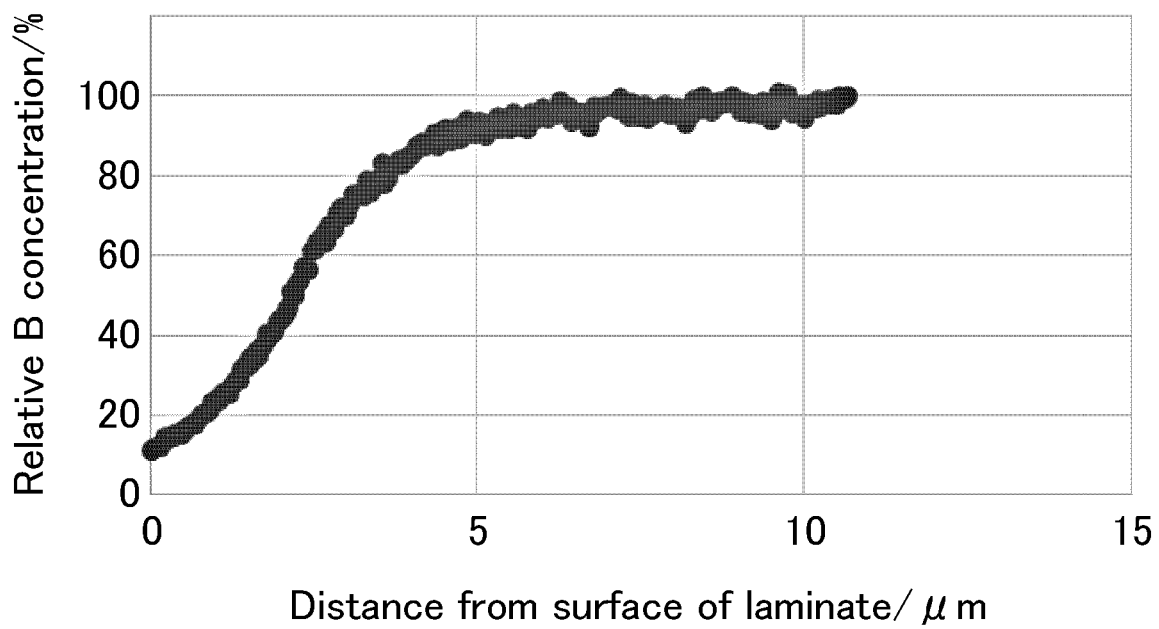
FIG. 2 is a graph of an example of the B concentration distribution relative to the distance from a surface of the laminate.

FIG. 2 is a graph of an example of the B concentration distribution relative to the distance from a surface of the laminate. FIG. 2 demonstrates that the B concentration increases as the distance from a surface of the laminate increases. The B concentration reaches a substantially constant value as the distance from the surface of the laminate becomes about 8 μm or greater. FIG. 2 shows the relative B concentration when the B concentration becoming a constant value is considered as 100%.

When the B concentration distribution is determined as shown in FIG. 2, a region where the B concentration becomes a constant value is defined as the inner layer portion, while a region where the B concentration changes is defined as the surface layer portion. Specifically, when the B concentration distribution is determined as shown in FIG. 2, a region from the surface of the laminate to a portion having a B concentration of 95% is defined as the surface layer portion when the B concentration becoming a constant value is considered as 100%. In other words, the laminate that is the measurement target in FIG. 2 is a laminate in which the B concentration of the surface layer portion is lower than the B concentration of the inner layer portion.

In the laminate of the present disclosure, the thickness of the surface layer portion is not constant. In the case where the B concentration changes relative to the distance from a surface of the laminate, the B concentration is low in a region where the distance from the surface is not greater than 2 μm. Thus, the B concentration at a position 2 μm apart from the surface of the laminate can be used as a representative value for the B concentration of the surface layer portion of the laminate. In the case where the B concentration changes relative to the distance from a surface of the laminate, the B concentration is high at the center of the laminate in the thickness direction. Thus, the B concentration at the central point of the thickness direction of the laminate can be used as a representative value for the B concentration of the inner layer portion of the laminate.

Even in the case where the B concentration changes relative to the distance from a surface of the laminate but the B concentration does not become a constant value in any region, e.g., in the case of a thin laminate, the B concentration is the highest at the central point of the thickness direction of the laminate. Thus, the B concentration at the central point of the thickness direction of the laminate may be used as a representative value for the B concentration of the inner layer portion of the laminate. In the case where the B concentration changes relative to the distance from a surface of the laminate but the B concentration does not become a constant value in any region, the central point of the thickness direction of the laminate is defined as the "inner layer portion" of the laminate. The B concentration at the central point of the thickness direction of the laminate can be used as a representative value for the B concentration of the inner layer portion of the laminate.

The "surface layer" and "inner layer" in the definitions described above have no relation to the positions of the respective glass ceramic layers constituting the laminate of the present disclosure. The boundary between the surface layer portion and the inner layer portion needs not to match the boundary of glass ceramic layers. The boundary of the surface layer portion and the inner layer portion may be present in a single glass ceramic layer closest to an outermost surface among the glass ceramic layers constituting the laminate of the present disclosure.

As described above, allowing the surface layer portion of the laminate to have a low B concentration causes a reduced coefficient of thermal expansion of each glass ceramic layer in the surface layer portion of the laminate. In consideration of the B concentration of the surface layer portion of the laminate, allowing each glass ceramic layer in the surface layer portion to have a low coefficient of thermal expansion can lead to an improved mechanical strength. In the case of using this technique to improve the mechanical strength, the filler (quartz) needs not to be replaced by glass or amorphous $SiO_2$, which has a higher dielectric loss than quartz. This can prevent a decrease in Q value.

In the laminate of the present disclosure, the depth of the surface layer portion from the surface is preferably 3 μm or more and 25 μm or less. The surface of the surface layer portion herein means the same as the surface of the laminate. The surface layer portion having a depth from the surface of 3 μm or more and 25 μm or less may have an appropriately large difference in B concentration between the surface of the surface layer portion (the surface of the laminate) and the deepest portion of the surface layer portion. This may result in a high compression stress that depends on the difference in coefficient of thermal expansion between the surface of the surface layer portion and the deepest portion of the surface layer portion. This is preferred because a much higher mechanical strength may be achieved.

In the laminate of the present disclosure, the B concentration preferably decreases in a continuous manner from the inner layer portion to the surface layer portion. In an embodiment of the method for producing a laminate to be described later, B is scattered from the surface of the multilayer green sheet by steam treatment. In this case, the B concentration is the highest in the inner layer portion of the laminate, while the B concentration is the lowest in the surface layer portion of the laminate. The B concentration in this case changes in a continuous manner. Whether the B concentration changes in a continuous manner or not is determined with a graph as shown in FIG. 2 obtained by measuring the B concentration at multiple points along the thickness direction of the laminate. The graph of FIG. 2 shows an example where the B concentration decreases in a continuous manner from the inner layer portion to the surface layer portion. The measurement points for the B concentration are preferably taken at 500 sites or more at intervals of 0.1 µm.

In the case of setting the B concentration relative to the distance from a surface of the laminate to decrease in a continuous manner from the inner layer portion to the surface layer portion, the compression stress acts more on the surface owing to the difference in coefficient of thermal expansion. This leads to a higher mechanical strength.

In the laminate of the present disclosure, also preferably, the B concentration decreases in a discontinuous manner from the inner layer portion to the surface layer portion. In an embodiment of the method for producing a laminate to be described later, the composition of the multilayer green sheet is changed such that the glass ceramic green sheet that constitutes an outermost layer of the laminate has a low B concentration, while the glass ceramic green sheet that constitutes the inner layer portion of the laminate has a high B concentration. In this case, the B concentration is low in the surface layer portion of the laminate, while the B concentration is high in the inner layer portion of the laminate. The B concentration in this case decreases in a discontinuous manner from the inner layer portion to the surface layer portion. Whether the B concentration changes in a discontinuous manner or not is determined with a graph that is obtained by measuring the B concentration at multiple points along the thickness direction of the laminate and that shows the relationship between the distance from a surface of the laminate and the B concentration. When the B concentration decreases stepwise from the inner layer portion to the surface layer portion in the graph, the B concentration is defined as decreasing in a discontinuous manner from the inner layer portion to the surface layer portion. The measurement points for the B concentration are preferably taken at 500 sites or more at intervals of 0.1 µm.

The glass contained in the surface layer portion and the glass contained in the inner layer portion may have the same composition or different compositions excluding the B concentration. However, they preferably have the same composition.

The laminate of the present disclosure preferably has the following features. First, the laminate preferably has a relative permittivity (measured at 3 GHz) of 4.5 or lower. The laminate also preferably has a Q value (measured at 3 GHz) of 450 or higher. The relative permittivity and Q value of the laminate can be measured by the perturbation method.

The Q value can be determined from the reciprocal of the dissipation factor (dielectric loss) measured at 3 GHz by the perturbation method.

The laminate preferably has a coefficient of thermal expansion of 5 ppm/K or higher and 10 ppm/K or lower in the surface layer portion, and 6 ppm/K or higher and 11 ppm/K or lower in the inner layer portion. The coefficient of thermal expansion can be determined as an average coefficient of thermal expansion within a range of room temperature (20° C.) to 600° C. using a TMA device.

The laminate preferably has a flexural strength, which is an index of the mechanical strength, of 200 MPa or higher. The flexural strength can be measured with a laminate cut into a cuboid having a size of 5×40 mm using a 3-point bending tester.

The laminate of the present disclosure may be used as a multilayer ceramic substrate. The multilayer ceramic substrate may be provided with a chip component. Mounting a chip component can provide an electronic component provided with a multilayer ceramic substrate. The electronic component of the present disclosure includes a multilayer ceramic substrate that includes the laminate of the present disclosure and a chip component mounted on the multilayer ceramic substrate.

The laminate of the present disclosure may be applied not only to the aforementioned multilayer ceramic substrate but also a chip component to be mounted on a multilayer ceramic substrate. Examples of the chip component include LC combined components such as LC filters, as well as capacitors and inductors. The laminate of the present disclosure may be applied to those other than the aforementioned multilayer ceramic substrate, electronic component, and chip component.

Next, a method for producing the laminate of the present disclosure is described below.

(1) Stacking

A glass powder containing $SiO_2$, $B_2O_3$, $Al_2O_3$, and $M_2O$, where M is an alkali metal, a quartz powder, and components such as a binder and a plasticizer are mixed to prepare ceramic slurry. The slurry is formed into sheets and dried, whereby glass ceramic green sheets are obtained. A glass ceramic green sheet to be provided with an internal electrode, among the glass ceramic green sheets, is provided with an internal electrode pattern by screen printing or photolithography using conductive paste. The conductive paste used is preferably a conductive paste containing Ag or Cu. These glass ceramic green sheets are stacked in multiple layers and press-bonded by, for example, hydrostatic pressing, whereby a multilayer green sheet is formed. The glass ceramic green sheets stacked may have the same glass composition. The B concentration can be changed by steam treatment in the subsequent firing.

The multilayer green sheet may be provided with a constraining layer on each of the upper and lower surfaces. The constraining layers are sheets containing as a main component an inorganic material that is substantially unsinterable at a temperature at which the glass ceramic green sheets are sinterable. The constraining layers are to be substantially unsintered during firing and therefore do not shrink. Thus, the constraining layers act to reduce shrinkage of the laminate in the main-surface direction. This results in an increased dimensional accuracy of the internal electrode provided for the laminate.

(2) Firing

The multilayer green sheet is fired and the glass ceramic green sheets are converted to glass ceramic layers, whereby a laminate is produced. The firing temperature is a temperature at which the glass ceramic green sheets are sinterable. For example, firing is preferably performed at 850° C. or higher and 1050° C. or lower for 10 minutes or longer and 120 minutes or shorter. The firing atmosphere may be either an air atmosphere or a reduced atmosphere.

The firing is performed in an environment containing steam. This is steam treatment including exposure to an environment containing steam at the firing temperature, and the steam treatment is a treatment of intentionally introducing steam into a firing furnace. The "environment containing steam" in the steam treatment means an environment where a larger amount of steam than commonly contained in the air is intentionally introduced. For example, the steam content in the firing furnace is preferably 20% by weight or more. The temperature and duration of the steam treatment is preferably 700° C. or higher and 1000° C. or lower and 5 minutes or longer and 60 minutes or shorter. Increasing the temperature of the steam treatment or extending the duration of the steam treatment can increase the depth of the surface layer portion from the surface of the laminate.

The steam treatment allows B to scatter from the surface of the multilayer green sheet. As a result, the B concentration is the highest in the inner layer portion (the central point of the thickness direction) of the laminate after the firing, while the B concentration is the lowest in the surface layer portion of the laminate. In this case, the B concentration decreases in a continuous manner from the inner layer portion to the surface layer portion in the laminate.

In the case of using the constraining layers, firing is performed at a temperature at which the glass ceramic green sheets are sinterable but the constraining layers are unsinterable, and the constraining layers are removed from the fired laminate by treatment such as sandblasting.

The laminate of the present disclosure may also be produced by the following method. Various conditions not mentioned below may be similar to the conditions in the aforementioned method for producing the laminate of the present disclosure.

(1') Stacking

Multiple glass ceramic green sheets having different B concentrations are prepared as the glass ceramic green sheets. The glass ceramic green sheet that constitutes an outermost surface of the laminate has a low B concentration, while the glass ceramic green sheet that constitutes the inner layer portion of the laminate has a high B concentration.

(2') Firing

The multilayer green sheet produced in the stacking is fired, whereby a laminate is produced. In this case, no steam treatment needs to be performed. The firing is performed at a temperature at which the glass ceramic green sheets are sinterable.

In the laminate thus produced, the B concentration is low in the surface layer portion of the laminate, while the B concentration is high in the inner layer portion of the laminate. In this case, the B concentration decreases in a discontinuous manner from the inner layer portion to the surface layer portion.

EXAMPLES

The following provides examples that more specifically disclose the laminate of the present disclosure. The present disclosure is not limited to these examples.

Production of Glass Powder

Glass material powders for each of Glass Nos. 1 to 8 were mixed according to the compositions shown in Table 1. The mixture was put into a Pt crucible and melted at 1500° C. for 30 minutes or longer in the air. The resulting melt was then rapidly cooled, whereby cullet was obtained. The materials of the alkali metal oxides used were carbonates instead of oxides. Table 1 shows the proportions each in an alkali metal oxide equivalent. The cullet was coarsely pulverized and put into a container together with ethanol and 5-mmΦ PSZ balls. The contents were then subjected to ball milling. The pulverization duration was adjusted so that a glass powder having a central particle size of 1 μm was obtained. The "central particle size" herein means the central particle size $D_{50}$ measured by laser diffraction/scattering analysis. Table 1 shows the compositions of Glass Nos. 1 to 8.

TABLE 1

| Glass No. | $SiO_2$ | $B_2O_3$ | $Li_2O$ | $K_2O$ | $Na_2O$ | $Al_2O_3$ |
|---|---|---|---|---|---|---|
| 1 | 72.0 | 26.0 | 1.0 | 0.0 | 0.0 | 1.0 |
| 2 | 75.0 | 22.0 | 1.0 | 0.5 | 0.5 | 1.0 |
| 3 | 75.0 | 24.0 | 0.9 | 0.0 | 0.0 | 0.1 |
| 4 | 80.0 | 18.0 | 1.5 | 0.0 | 0.0 | 0.5 |
| 5 | 80.0 | 18.0 | 0.0 | 1.5 | 0.0 | 0.5 |
| 6 | 80.0 | 17.5 | 0.0 | 0.0 | 1.5 | 1.0 |
| 7 | 80.0 | 15.0 | 0.5 | 2.0 | 0.5 | 2.0 |
| 8 | 88.0 | 10.0 | 1.5 | 0.0 | 0.0 | 0.5 |

Production of Glass Ceramic Green Sheet

The glass powder and quartz powder (central particle size: 1 μm) were put into ethanol according to the compositions shown in Table 2 and mixed with a ball mill. The mixture was further mixed with a binder solution of polyvinyl butyral dissolved in ethanol and a dioctyl phthalate (DOP) solution serving as a plasticizer, whereby slurry was prepared. The slurry was applied in a pattern to a PET film using a doctor blade and dried at 40° C. Thereby, a 50-μm-thick glass ceramic green sheet was obtained. Table 2 shows the compositions of Sheet Nos. 1 to 9. Sheet No. 9 is the same as Sheet No. 8 except that the filler was changed from the quartz powder (central particle size: 1 μm) to amorphous $SiO_2$ (central particle size: 1 μm).

TABLE 2

| Sheet No. | Glass No. | Glass content (wt %) | Quartz content (wt %) | Amorphous $SiO_2$ content (wt %) | Coefficient of thermal expansion (ppm/K) |
|---|---|---|---|---|---|
| 1 | 1 | 70.0 | 30.0 | 0.0 | 8.1 |
| 2 | 2 | 70.0 | 30.0 | 0.0 | — |
| 3 | 3 | 70.0 | 30.0 | 0.0 | — |
| 4 | 4 | 70.0 | 30.0 | 0.0 | — |
| 5 | 5 | 70.0 | 30.0 | 0.0 | — |
| 6 | 6 | 70.0 | 30.0 | 0.0 | — |
| 7 | 7 | 70.0 | 30.0 | 0.0 | — |
| 8 | 8 | 70.0 | 30.0 | 0.0 | 6.9 |
| 9 | 8 | 70.0 | 0.0 | 30.0 | 5.2 |

Evaluation of Sinterability and Coefficient of Thermal Expansion

For each of the glass ceramic green sheets of Sheet Nos. 1 to 9, the glass ceramic green sheet, which is to be formed into a sample for evaluating the sinterability, was cut into 50-mm-square pieces, and 20 pieces thereof were stacked, put into a mold, and compressed using a press. This compressed article was cut into a cuboid having a size of 15×5 mm and fired at 900° C. for 30 minutes in the air. Thereby, a laminate was produced. To reduce the B concentration around the surfaces, the laminate was further subjected to a treatment in which the laminate was exposed to the air containing 35% by weight steam at 900° C. for 10 minutes during the firing at 900° C. for 30 minutes in the air. Each laminate was subjected to secondary ion mass spectrometry (SIMS) for determination of the B concentration distribution relative to the distance from a surface of the laminate. FIG. 2 shows the result of determining the B concentration distribution relative to the distance from a surface of the laminate of Sheet No. 2.

The firing was followed by checking whether the cut surface of the laminate was impregnated and colored with ink. All laminates were neither impregnated nor colored with ink, and thus regarded as having good sinterability. For each of the laminates of Sheet Nos. 1, 8, and 9, the average coefficient of thermal expansion was measured within a range of room temperature (20° C.) to 600° C. using a TMA device. The results of measuring the coefficient of thermal expansion are shown in Table 2.

Table 3 shows Examples 1 to 8 and Comparative Examples 1 to 4. The laminates produced according to Sheet Nos. 1 to 8 with the steam treatment correspond to Examples 1 to 8, while the laminate produced according to Sheet No. 9 with the steam treatment corresponds to Comparative Example 1. The laminates produced for the purpose of comparison according to Sheet Nos. 1 and 2 with no steam treatment during the firing correspond to Comparative Examples 2 and 3.

In Comparative Example 4, the glass ceramic green sheet of Sheet No. 8 was cut into 50-mm-square pieces, and 15 pieces thereof were stacked. This stack was provided with a 50-mm-square piece cut out of the glass ceramic green sheet of Sheet No. 9 on each of the upper and lower surfaces. The workpiece was compressed, and then fired at 900° C. for 30 minutes in the air, whereby a laminate was produced. No steam treatment was performed during the firing.

Evaluation of Permittivity and Q Value

Samples for evaluating the permittivity and dielectric loss were prepared as follows. The glass ceramic green sheet was cut into 50-mm-square pieces, and 15 pieces thereof were stacked, compressed, and fired at 900° C. for 30 minutes in the air.

For the samples after the firing, the thickness was measured, and the permittivity and Q value (the reciprocal of the dielectric loss) were measured at 3 GHz by the perturbation method. The evaluation criteria were such that those having a permittivity of 4.5 or lower and those having a Q value of 450 or higher were evaluated as good. The results for the laminates produced in Examples 1 to 8 and Comparative Examples 1 to 4 are shown in Table 3.

Evaluation of Flexural Strength

Samples for evaluating the flexural strength prepared were 20 laminates each produced by compression, cutting into a cuboid having a size of 5×40 mm, and firing. For each laminate, the thickness and width were measured, and the flexural strength was measured using a 3-point bending tester. The evaluation criteria were such that those having an average flexural strength of 200 MPa or higher were evaluated as good. The results for the laminates produced in Examples 1 to 8 and Comparative Examples 1 to 4 are shown in Table 3.

TABLE 3

|  | Sheet No. | Steam treatment during firing | Permittivity at 3 GHz | Q value at 3 GHz | Flexural strength (MPa) | Evaluation |
|---|---|---|---|---|---|---|
| Example 1 | 1 | Performed | 4.1 | 540 | 230 | Good |
| Example 2 | 2 | Performed | 3.9 | 480 | 280 | Good |
| Example 3 | 3 | Performed | 3.8 | 460 | 260 | Good |
| Example 4 | 4 | Performed | 3.7 | 500 | 210 | Good |
| Example 5 | 5 | Performed | 3.8 | 550 | 300 | Good |
| Example 6 | 6 | Performed | 3.9 | 470 | 220 | Good |
| Example 7 | 7 | Performed | 4.1 | 580 | 260 | Good |
| Example 8 | 8 | Performed | 4.0 | 520 | 220 | Good |
| Comparative Example 1 | 9 | Performed | 3.8 | 350 | 220 | Q value: poor |
| Comparative Example 2 | 1 | Not performed | 4.1 | 540 | 110 | Flexural strength: Poor |
| Comparative Example 3 | 2 | Not performed | 3.9 | 480 | 110 | Flexural strength: Poor |
| Comparative Example 4 | Surface 9 Inner 8 | Not performed | 3.9 | 410 | 250 | Q value: poor |

In Examples 1 to 8, the steam treatment was performed during the firing, and the B concentration of the surface layer portion of the laminate was lower than the B concentration of the inner layer portion of the laminate. The B concentration decreased in a continuous manner from the inner layer portion to the surface layer portion in the laminate. The evaluation results were good for the respective evaluation items. In Comparative Example 1, the filler used was changed from quartz to amorphous $SiO_2$. Thus, the laminate has a low Q value. In Comparative Examples 2 and 3, no steam treatment was performed. Thus, the B concentration was at a similar degree in the whole laminate and the flexural strength was insufficient in these cases. In Comparative Example 4, the surface layer portion derived from the glass ceramic green sheet of Sheet No. 9 had a low coefficient of thermal expansion and thus the laminate had a good flexural strength. In contrast, since the glass ceramic green sheet of Sheet No. 9 contained amorphous $SiO_2$ as a filler, the laminate had a low Q value.

Evaluation of Influence by Steam Treatment Conditions

To reduce the B concentration around the surface of the laminate, the glass ceramic green sheet of Sheet No. 2 fired at 900° C. for 30 minutes in the air was subjected to either of the following two experiments. One was such that the workpiece was exposed to the air containing steam at 850° C. for 10 minutes (Example 9). The other was such that the workpiece was exposed to the air containing steam at 950° C. for 30 minutes (Example 10). Each laminate was subjected to secondary ion mass spectrometry (SIMS) for the determination of the B concentration distribution relative to the distance from a surface of the laminate. When the B concentration becoming a constant value is considered as 100%, the relative B concentration of the surface of the laminate and the depth of a region from the surface of the laminate to a portion where the B concentration is 95% (the depth of the surface layer portion) were measured. For the samples produced under these conditions, the permittivity, Q value, and flexural strength were measured. The results of these measurements are collectively shown in Table 4.

TABLE 4

| | Sheet No. | Temperature and duration of steam treatment during firing | Depth of surface layer portion | Permittivity at 3 GHz | Q value at 3 GHz | Flexural strength (MPa) | Evaluation |
|---|---|---|---|---|---|---|---|
| Example 2 | 2 | 900° C./10 min | 12%, 7 μm | 3.9 | 480 | 280 | Good |
| Example 9 | 2 | 850° C./10 min | 40%, 3 μm | 3.9 | 480 | 260 | Good |
| Example 10 | 2 | 950° C./30 min | 10%, 25 μm | 3.9 | 470 | 280 | Good |

Even though the temperature and duration of the steam treatment during the firing were changed as described above, the evaluation results were good for the respective evaluation items.

Evaluation of Influence by Firing Conditions

In Example 11, the compressed article was provided with an alumina sheet serving as a constraining layer on each main surface before firing. In Example 12, the firing atmosphere was a reduced atmosphere. For the samples produced under these conditions, the permittivity, Q value, and flexural strength were measured. The temperature and duration of the steam treatment were as shown in Table 5.

TABLE 5

| | Sheet No. | Temperature and duration of steam treatment during firing | Other production conditions | Permittivity at 3 GHz | Q value at 3 GHz | Flexural strength (MPa) | Evaluation |
|---|---|---|---|---|---|---|---|
| Example 11 | 2 | 900° C./10 min | Constraining layers | 3.9 | 490 | 260 | Good |
| Example 12 | 2 | 900° C./30 min | Reduced firing | 3.9 | 480 | 250 | Good |

Even in the case of firing with the constraining layers and in the case of reduced firing, the evaluation results were good for the respective evaluation items. The presence of the constraining layers allowed an internal electrode provided for the laminate to have an increased dimensional accuracy. The reduced firing allowed the use of a Cu electrode.

Evaluation of Use of Multiple Types of Glass Ceramic Green Sheets

In Example 13, the glass ceramic green sheet of Sheet No. 1 was cut into 50-mm-square pieces, and 15 pieces thereof were stacked. This stack was provided with a 50-mm-square piece cut out of the glass ceramic green sheet of Sheet No. 8 on each of the upper and lower surfaces. The workpiece was compressed, and then fired at 900° C. for 30 minutes in the air. Thereby, a sample was produced. No steam treatment was performed during the firing. For the sample of Example 13, the permittivity, Q value, and flexural strength were measured. The results are shown in Table 6.

TABLE 6

| | Sheet No. | Steam treatment during firing | Permittivity at 3 GHz | Q value at 3 GHz | Flexural strength (MPa) | Evaluation |
|---|---|---|---|---|---|---|
| Example 13 | Surface 8 Inner 1 | Not performed | 4.0 | 530 | 250 | Good |

In Example 13, the B concentration decreased in a discontinuous manner from the inner layer portion to the surface layer portion, and the evaluation results were good for the respective evaluation items.

1: laminate
9, 10, 11: conductive film
12: via hole conductor
20: glass ceramic layer

The invention claimed is:

1. A laminate comprising multiple glass ceramic layers each containing quartz and a glass, wherein the glass contains $SiO_2$, $B_2O_3$, $Al_2O_3$, and $M_2O$, and wherein M is an alkali metal,
a B concentration of the laminate being lower at a surface layer portion of the laminate than at an inner layer portion of the laminate.

2. The laminate according to claim 1,
wherein the B concentration decreases in a continuous manner from the inner layer portion to the surface layer portion.

3. The laminate according to claim 1,
wherein the B concentration decreases in a discontinuous manner from the inner layer portion to the surface layer portion.

4. The laminate according to claim 1,
wherein the surface layer portion has a depth of 3 μm or more and 25 μm or less from a surface of the laminate.

5. The laminate according to claim 1, further comprising an internal electrode containing Ag or Cu.

6. An electronic component comprising
a multilayer ceramic substrate including the laminate according to claim 1, and
a chip component mounted on the multilayer ceramic substrate.

7. The laminate according to claim 2,
wherein the surface layer portion has a depth of 3 μm or more and 25 μm or less from a surface of the laminate.

8. The laminate according to claim 3,
wherein the surface layer portion has a depth of 3 μm or more and 25 μm or less from a surface of the laminate.

9. The laminate according to claim 2, further comprising an internal electrode containing Ag or Cu.

10. The laminate according to claim 3, further comprising an internal electrode containing Ag or Cu.

11. The laminate according to claim 4, further comprising an internal electrode containing Ag or Cu.

12. An electronic component comprising
a multilayer ceramic substrate including the laminate according to claim 2, and
a chip component mounted on the multilayer ceramic substrate.

13. An electronic component comprising
a multilayer ceramic substrate including the laminate according to claim 3, and
a chip component mounted on the multilayer ceramic substrate.

14. An electronic component comprising
a multilayer ceramic substrate including the laminate according to claim 4, and
a chip component mounted on the multilayer ceramic substrate.

15. An electronic component comprising
a multilayer ceramic substrate including the laminate according to claim 5, and
a chip component mounted on the multilayer ceramic substrate.

\* \* \* \* \*